(12) United States Patent
Patterson et al.

(10) Patent No.: US 7,615,318 B2
(45) Date of Patent: Nov. 10, 2009

(54) PRINTING OF DESIGN FEATURES USING ALTERNATING PSM TECHNOLOGY WITH DOUBLE MASK EXPOSURE STRATEGY

(75) Inventors: Kyle Patterson, Froges (FR); Yves Rody, La Terrasse (FR); Christophe Couderc, Saint-Nazaire (FR); Corinne Miramond-Collet, Saint Martin (FR)

(73) Assignees: Freescale Semiconductor Inc., Austin, TX (US); STMicroelectronics (Crolles 2) SAS, Crolles (FR)

( * ) Notice: Subject to any disclaimer, the term of this patent is extended or adjusted under 35 U.S.C. 154(b) by 428 days.

(21) Appl. No.: 11/253,061

(22) Filed: Oct. 18, 2005

(65) Prior Publication Data

US 2006/0188792 A1  Aug. 24, 2006

(30) Foreign Application Priority Data

Oct. 22, 2004  (EP)  .................................. 04292516

(51) Int. Cl.
*G03F 1/00*  (2006.01)

(52) U.S. Cl. .............................. 430/5; 716/19; 430/394
(58) Field of Classification Search ...................... 430/5, 430/394; 716/19–21
See application file for complete search history.

(56) References Cited

U.S. PATENT DOCUMENTS

| | | | | |
|---|---|---|---|---|
| 6,338,922 | B1* | 1/2002 | Liebmann et al. | 430/5 |
| 6,675,369 | B1* | 1/2004 | Lukanc et al. | 430/5 |
| 6,749,970 | B2* | 6/2004 | Lukanc et al. | 430/5 |
| 7,229,722 | B2* | 6/2007 | Liebmann et al. | 430/5 |
| 2001/0000240 | A1* | 4/2001 | Wang et al. | 430/5 |
| 2003/0162102 | A1* | 8/2003 | Pierrat | 430/5 |

* cited by examiner

*Primary Examiner*—Mark F Huff
*Assistant Examiner*—Stewart A Fraser
(74) *Attorney, Agent, or Firm*—Gardere Wynne Sewell LLP

(57) ABSTRACT

For cases where one edge of a design feature is to be printed through a shifter mask and another one is to be printed through a binary trim mask, and where no upsizing can be performed due to the local density of the design, it is proposed to add shifters with respect to the shifter mask in such a way that all the edges are printed by the phase shift mask.

12 Claims, 1 Drawing Sheet

PRINTING OF DESIGN FEATURES USING ALTERNATING PSM TECHNOLOGY WITH DOUBLE MASK EXPOSURE STRATEGY

PRIORITY CLAIM

This application claims priority from European Application for Patent No. 04 292516.4 filed Oct. 22, 2004, the disclosure of which is hereby incorporated by reference.

BACKGROUND OF THE INVENTION

1. Technical Field of the Invention

The present invention relates generally to the manufacturing of small dimension features of objects, such as integrated circuits, using photolithography techniques. More particularly, it relates to a method of printing design features within a photosensitive material using alternating Phase Shift Mask (PSM) technology with a double mask exposure strategy, and to a method of fabricating a mask set comprising a phase shift mask and an associated binary trim mask.

2. Description of Related Art

Photolithography, in the context of manufacturing of semiconductor devices is the process of patterning windows in a layer made of photosensitive material (sometimes referred to as photoresist or resist layer), which layer typically covers a semiconductor substrate. These windows expose small areas in which the semiconductor substrate is modified by a subsequent processing operation. For instance, the manufacturing of CMOS integrated circuits involves several iterations of a process sequence, including the patterning of a respective resist layer, followed by the execution of an etch, implant, deposition, or other similar operation, and then by the removal of the remaining resist to make way for a new resist layer to be applied for another iteration.

Due to the continuous decrease in the size of printed dimensions, tighter design rules are required for laying out small dimensions design features on a semiconductor substrate. More particularly, it is desirable to address the problem of patterning so-called Critical Dimension (CD) design features. The Critical Dimension is the minimum dimension of features allowed by the design rules in a given technology. For example, present 60 nm technology allows achieving lines of 60 nm width as the CD. This CD is usually less than the optical wavelength used to print it inside photoresist.

In this context, various methods for increasing resolution of photolithographic images toward the sub wavelength range have been proposed. One of the techniques known in the current state of the art uses the alternating Phase Shift Mask (Alt PSM, for short) technology. Using the Alt PSM technique allows one to increase the resolution and the contrast of line segments inside the photo resist.

In the context of the Alt PSM technique, a design pattern, e.g., a line segment, is printed by the shift mask when it exhibits a critical dimension (a CD constraint) so that it cannot be oversized and/or when its edges must be located very precisely (a localization constraint). Thanks to this technique, a line segment with as low as a 60 nm width can be defined, and its edges can be located with a spatial precision of little as 3 nm.

A number of Alt PSM techniques already exist, including both a single mask approach as well as double mask approach, either with dual phases or triple phases. The double mask approach, which relies on a double mask exposure strategy, has reached such maturity that commercial software tools are now available in the market place which supports this technique. However, further printing enhancement techniques still need to be developed and implemented to be able, for instance, to print a gate length of around 60 nm after photolithography.

Conventionally, the phase shift mask defines only the central portion width of a line segment. Stated otherwise, it is not suitable for defining the ends of the line segment, which are thus to be defined by a conventional mask, namely the binary trim mask. Besides, the phase shift mask provides a precision of as little as 3 nm on the location of each edges.

For instance, in a number of layout configurations the pattern of the design which is to be printed, e.g., a Poly-Silicon (Poly-Si) line segment, will be defined on one edge by the phase shift mask and on the other edge by the binary trim mask. When, as a result of the density of the design this line segment cannot be upsized, a photolithography process marginality leading a discontinued (interrupted) line can emerge. The reasons for this are the mask-to-mask overlay error, the reticle alignment error and the scanner stage positioning error. The merging of these error contributions can lead to a 15-20 nm fine-width loss. This leads to highly focus sensitive areas of the design to be printed, with the risk of discontinued (interrupted) Poly-Si lines.

There is accordingly a need in the art to further improve the Alt PSM technology, whereby to alleviate the foregoing and other problems.

SUMMARY OF THE INVENTION

In accordance with the present invention, a mask set making routine is provided that selectively expands desired features on the phase shift mask to create protect shapes for the trim mask In accordance with a first aspect of the present invention, a method for printing design features within a photosensitive material using alternating Phase Shift Mask technology is presented which is based on a double mask exposure strategy. For all the cases where one edge of the pattern is printed through the shifter mask and another one is printed through the trim mask and where no upsizing can be performed due to the local density of the design, it is proposed to add shifters in such a way that all the edges are printed by one mask, namely the phase shift mask.

In this context, a design feature is not intended to be limited to a continuous (i.e., in one block) portion of a given material such as Poly-Si. On the contrary, a design feature may comprise a plurality of separate (i.e., discontinuous) portions. Also a design feature may include a portion that is part of a continuous block of said material, e.g., a portion of a line segment that is comprised of a plurality of contiguous portions.

In accordance with a second aspect of the present invention, another method of fabricating a mask set comprising a phase shift mask and an associated binary trim mask, is presented. Advantageously, the binary trim mask is designed to define dummy patterns as well, and the localization of said dummy patterns takes into account, among others, the position and the dimensions of the upsized design features.

In accordance with an embodiment of the invention, a method comprises identifying first, second and third design features which are proximately located to one another, wherein the first design feature has critical dimensions, and the second and third design features do not have critical dimensions, but wherein at least a first portion of the second design feature cannot be subject to an upsizing effect due to its proximity to the third design feature. The method further comprises defining a phase shift mask and an associated binary trim mask, such that edges of the first design feature along with certain edges of the second design feature associated with the first portion not to be upsized and at least a portion of one edge of the third design feature are to be defined by the phase shift mask, and further such that remaining edges of the third design feature along with edges of the second design feature associated with a second portion that may be subject to an upsizing effect are to be defined by the binary trim mask.

BRIEF DESCRIPTION OF THE DRAWINGS

Other characteristics and advantages of the invention will become further apparent on reading the description which follows. The latter is purely illustrative and should be read in conjunction with the appended drawings, in which.

DETAILED DESCRIPTION OF THE DRAWINGS

Figure 1:
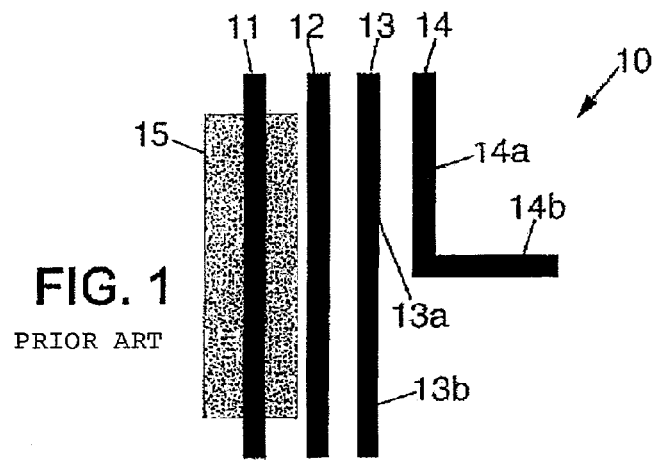
FIG. 1 is a planar top view showing an exemplary design in a semiconductor device.

An application of the invention will now be described, in the context of the manufacturing of a mask set, intended to be used for printing a CMOS transistor gate having a length of around 70 nm, as well as some conductive lines. In the drawings, like reference numbers designate like parts in various Figures.

FIG. 1 shows an exemplary target design, as may be present in any semiconductor device. The design comprises line segments 11-14 and a MOS gate 11, all made of Poly-Si (in solid black), at the surface of a semiconductor substrate. This substrate incorporates at least one active zone. Such a zone is represented in FIG. 1 in the form of a window 15 (with a stippled pattern). The window 15 may be formed by any conventional doping method. The design comprises one gate segment 11, and three conductive line segments 12-14. Let us assume that gate segment 11 extends in a given longitudinal direction. For instance, line segments 12 and 13 are extending parallel to said longitudinal direction of gate segment 11, line segment 12 lying between gate segment 11 and line segment 13. Line segment 14 is L-shaped, having a first portion 14a extending parallel to gate segment 13, on the side thereof which is opposite to line segment 12, and a second portion 14b extending perpendicular to said first portion, away from line segment 13. The upper portion of line segment 13, which faces portion 14a of line segment 14, bears reference sign 13a. The remaining, i.e., lower portion, of line segment 13 bears reference sign 13b.

Gate segment 11 has a central portion which overlies the active zone 15, and two opposite end portions whose projection on the surface of the substrate is out of the active zone area. More precisely, gate segment 11 extends outside of the active zone 15 on at least two places, so as to form a MOS transistor. The width of gate segment 11 corresponds to the gate length of said transistor. In one embodiment, this width is equal to about 60 nm±6 (that is ±3 nm on each edge, amounting to a total width variation of ±6 nm) in the portion overlapping the active zone 15, and about 60 nm±40 elsewhere. Line segments 12-14 have a width of about 60 nm±40.

Such width of 60 nm±40 can be obtained using the binary trim mask only if the segment is oversized.

Design features corresponding to the Poly-Si gate and line segments are to be printed within a resist layer overlying the substrate. Stated otherwise, the printed design features are to be transferred to the resist layer by way of photolithography patterning.

Note that, in a general manner, design features like a MOS gate are determined to have critical dimensions as a result of the overlap of the segment (gate segment) and the underlying active zone being below a certain size, e.g., 130-140 nm.

Here, the portion of gate segment 11 overlapping the active zone 15 is determined to be a critical gate (that is to say, to have CDs), whereas the remainder of said gate and all line segments 12-14 are determined to have non CD constraints and no density constraints. This determination step is carried out using any conventional design tool (such as computer-aided design software) suitable for that purpose. Such software is adapted for processing data files containing data defining the design to be fabricated.

Stated otherwise, a first design feature 11 has CDs, whereas a second design feature comprised of portions 12 and 13a, as well as a third design feature comprised of portions 13b and 14a, do not have CDs. However, all these design features are adjacent one to the other.

Design features thus determined to have CDs must be printed using Alt PSM technology, due to existing limits of the conventional photolithography techniques. In the context of the present invention, an Alt PSM process based on a double mask exposure strategy is foreseen and utilized.

In the embodiment which is described here, the mask set, which is comprised of a phase shift mask and a binary trim mask, is intended to be used to print an image in a light-sensitive layer that is a made of positive resist. Exposure to light results in polymerization of such negative resist, whereby the resist in the regions exposed is changed from an insoluble condition to a soluble condition. Resist development is the step of removing the soluble portions with chemical solvents (developers), which leaves a hole in the resist layer that corresponds to the clear pattern on the mask (reticle). The resist thus patterned is subsequently used to form the line segments and the MOS gate using conventional methods. Here, for instance, they are formed by carrying out Poly-Si deposition and planarization.

In a configuration called a "clear field mask", the masks have light blocking regions (dark patterns), and open light transmitting regions (clear patterns). The light blocking regions comprise Chrome and correspond to the target features. The open light transmitting regions surround the target features.

Figure 2:
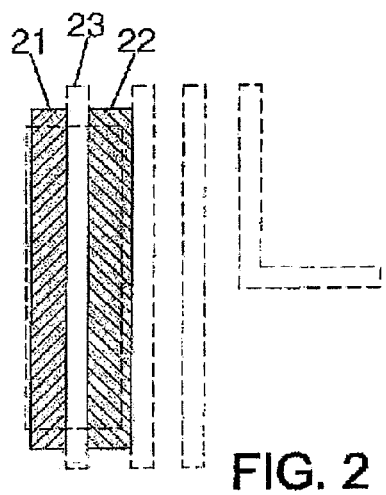
FIGS. 2 and 3 are planar views respectively illustrating a phase shift mask and a binary trim mask, as defined by a mask making method according to the prior art, suitable for printing the design features shown in FIG. 1.

Referring now to FIG. 2, there is shown therein the layout of the phase shift mask, as defined by a method according to the prior art. For the sake of better understanding, the design features 11-14 as well as the active zone 15 are also represented in dotted lines.

The phase shift mask is a dark field mask whose function is to print the design features which have critical dimensions only. From a structural standpoint, it comprises a Chrome layer extending beneath a Quartz layer, said Chrome layer having apertures defining phase shifting areas (shifters). Shifters are assigned, in an alternate fashion, a first phase shift value (let us say 0, in one example) or a second phase shift which is 180° out of phase with said first phase shift (that is $\pi$, in the example). The respective phase shift values depend on the deepness of the hole made in the Quartz material and on the wave length of the light.

In the example shown in FIG. 2, the phase shift mask layout is comprised of two defined phase shifting areas 21 and 22. For instance, shifter 21 is assigned π as its relative phase value, and phase shifter 22 is assigned 0 as its relative phase value. The shifters are separated by an opaque (dark) pattern 23 of predetermined width. Stated otherwise, shifters 21 and 22 each have one respective edge, facing one to the other, which define the opaque field 23. The opaque pattern 23 corresponds to the gate segment 11. Its width thus equals the desired gate length of the MOS transistor being fabricated, that is 60 nm in the example. The clear pattern 21 corresponds (for instance) to an increased phase of the light (denoted "phase +") and the clear pattern 22 corresponds (for instance) to a decreased phase of the light (denoted "phase −").

Another edge of shifter 22, opposite to the edge thereof which faces shifter 21, is conventionally set to define one edge of line segment 12.

Note that phase shifting areas 21 and 22 may extend beyond the portion of the gate segment 21 which overlies the active zone 15, in a direction parallel to the main axis of said gate segment 21, to compensate for alignment errors.

The edge of line segment 12 facing the MOS gate 11 is to be positioned very precisely, so that no overlap with the active zone 15 may arise. As a consequence, this edge of line segment 12 is intended to be defined by the phase shift mask, and more precisely by shifter 22.

The phase shift mask thus defined is fabricated upon the resist layer, and then it is used to selectively expose said resist layer during a first step of lighting.

Figure 3:
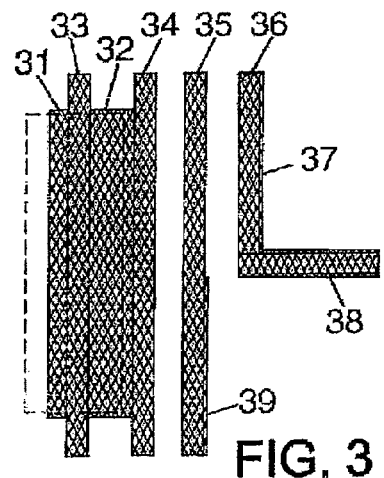

FIG. 3 illustrates the layout of a binary trim mask defined in accordance with the prior art, which is associated to the phase shift mask of FIG. 2. For the sake of better understanding, the active zone 15 is also represented in dotted lines.

The binary trim mask is a clear field mask, which has three functions.

Firstly, it is used to protect the already exposed areas, that is to say the areas exposed through the phase shift mask during the first step of lighting, as well as the space lying there between, that is to say the critical gate segment 11. To this end, it comprises opaque (dark) portions 31 and 32 on the one hand, and another opaque portion 33 on the other hand. Portions 31 and 32 match the phase shift areas respectively 21 and 22, of the phase shift mask, at least near their respective edges which face each other to define the opaque field 23. Portion 33 matches the gate segment 11.

Secondly, it must define the design features having non critical dimensions, that is to say the line segments 12-14. For that purpose, it comprises further opaque (dark) portions 34-36, corresponding to said line segments 12-14, respectively. It shall be noted that portions 31-34 are contiguous. This is in order to ensure that the longitudinal edge of line segment 12 which is opposite to the one facing the gate segment 11 be defined by the binary trim mask. It shall also be observed that, provided that there is enough room thereto, definition of the line segments 12-14 may be subject to an upsizing effect unless, of course, there is a CD constraint. This effect is aimed at protecting the design from discontinued (interrupted) line segments, which may result from photolithography marginalities. To this end, the layout of the binary trim mask selectively comprises additional opaque portions 37-39, which are contiguous to the portions 34-36 corresponding to the line segments, and which extend there from in the direction of free areas. By free areas, it is meant areas wherein there is no other design feature lying, except outside a vicinity area of predetermined size around the portion considered. Here, an additional portion 39 is provided as an extension of the portion 35. Portion 39 is contiguous to the main (longitudinal) edge of portion 35 opposite to portion 34, and extends in the direction opposite to said portion 34, except in the part of said main edge of portion 35 which is faced by adjacent portion 36. In the same way, additional portions 37 and 38 are provided, which are contiguous to the main edges of portion 36 and extend there from, in all directions but in the direction where adjacent portion 35 is lying.

Thirdly, the binary trim mask is to remove all the remaining resist. Therefore, it exhibits an open area in the rest of the layout. When dummy patterns (so-called "dummies") must be inserted in order to ensure a more constant density of the deposited material (be it either metal or poly-Si), said dummies are patterned by the binary trim mask as well. It is recalled that more or less constant density of the material deposited at the wafer surface is desirable to obtain satisfying planarization when CMP (Chemical and Mechanical Planarization) process is performed in respect of an overlying oxide ($SiO_2$) layer. Planarity of said oxide layer is required so that metal features designed within the next (still overlying) metal layer may have more constant thickness and thus be less subject to cracks.

Advantageously, the positioning of the dummies takes into account, among other characteristics, the position and the dimensions of the portions of the design features which have been oversized in accordance with the method for printing described above. Stated otherwise, the definition of the binary trim mask in respect of the to be inserted dummies is adapted to the to be printed design features, as defined in accordance with the two round method of defining according to the present invention.

After being fabricated according to the definition illustrated by the layout of FIG. 3, the binary trim mask is used at a second exposure step, which ends the printing of the desired pattern within the resist layer.

As was mentioned before, one main/longitudinal edge of line segment 12 (i.e., the edge facing the gate segment 11) is to be defined by the phase shift mask, whereas the opposite edge (i.e., the edge facing the adjacent line segment 13) is to be defined by the binary trim mask. For better readability, such a design feature is called a complex design feature in what follow. In order to avoid the risk of such complex design feature being discontinued due to misalignment of the two masks, also called overlay error, provision could be made of an upsizing of said complex design feature.

In the present exemplary application, in which line segment 12 is determined to be a complex design feature, this would require extending portion 34 of the binary trim mask layout in the direction opposite to portion 32 thereof. However, this is not always possible, such as in the configuration considered here. Indeed, there is not always sufficient room between the line segment to be extended and another line segment (or any other design feature) which is adjacent thereto, and lies within a vicinity area of determined size extending from this to be extended line segment.

Therefore it is proposed the following provision, when it is determined that any complex design feature like line segment 12 cannot be subject to an upsizing effect due to its proximity with any other design feature such as line segment 13. The resolution of the printed pattern can thus be enhanced, by modifying the phase shift mask definition and the associated binary trim mask definition, so that the phase shift mask become suitable for additionally defining all edges of said complex design feature (which, thus, turn to loose its nature of complex design feature).

Further, edges of any other design feature (like upper portion 13a of line segment 13 in the present exemplary application) which is adjacent to the initially complex design feature, but cannot be subject to an upsizing effect due to same kind of proximity issue, is to be defined only by the phase shift mask as well.

Still further, the modified phase shift mask is made suitable for defining one edge of the next design feature, provided that this design feature might be subject to upsizing, whereas the binary trim mask is modified to become suitable for defining another edge of said upsized design feature.

Stated otherwise, embodiments of the present invention propose that supplemental shifters be added to the phase shift mask, whereby all edges of co-adjacent design features are to be defined by said phase shift mask, until it is found a design feature (or a part of a design feature) for which upsizing is possible. This latter design feature is then defined as one complex design feature, in the meaning indicated above.

Figure 4:
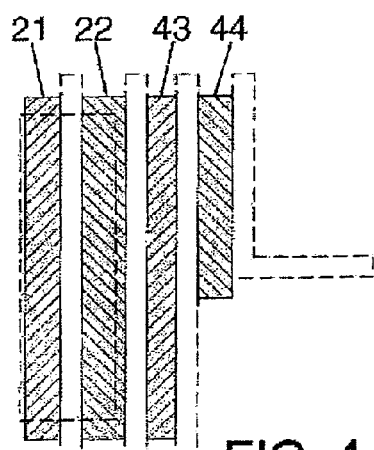
FIGS. 4 and 5 are planar views respectively illustrating a phase shift mask and a binary trim mask, as defined by the mask making method according to an embodiment of the present invention, suitable for printing the design features shown in FIG. 1.

Turning now to FIG. 4, there is shown therein the layout of a phase shift mask, as defined by a method according to the teaching of the present invention, adapted to print the design of FIG. 1. FIG. 4 is to be compared with FIG. 2, the elements 21 and 22 of which have counterparts that bear the same reference signs and that will not be described again.

In addition to the phase shifting areas 21 and 22, the phase shift mask of FIG. 4 comprises two other phase shifting areas, namely shifters 43 and 44.

Shifter 43 is arranged so that one main (longitudinal) edge of it, turning to the already existing shifter 22, is to define the edge of line segment 12 opposite to line segment 11, and so that its opposite edge is to define a first (left) edge of line segment 13.

Similarly, shifter 44 is arranged so that one main (longitudinal) edge of it, turning to shifter 43, is to define another (right) edge of line segment 13 opposite to said first edge thereof, and so that its opposite edge is to define a first (left) edge of line segment 14. Actually, shifter 44 does not extend, along the longitudinal direction of segment line 13, as much as said segment line 13. On the contrary, it is limited to the portion of segment line 13 (upper portion 13a) which is faced with segment line 14. Thus, the rest of segment line 13 (lower portion 13b) is to be defined by the associated binary trim mask.

Stated otherwise, design features comprised of portions 11, 12 and 13a have their two edges defined by the phase shift mask. Design features comprised of portions 13b and 14a have one edge defined by said phase shift mask and the other defined by the binary trim mask. And the design feature comprised of portion 14b has both edges defined by said binary trim mask.

In order to comply with the phase alternation rule, shifters 43 and 44 are assigned a phase shifting value of π and 0, respectively.

Figure 5:
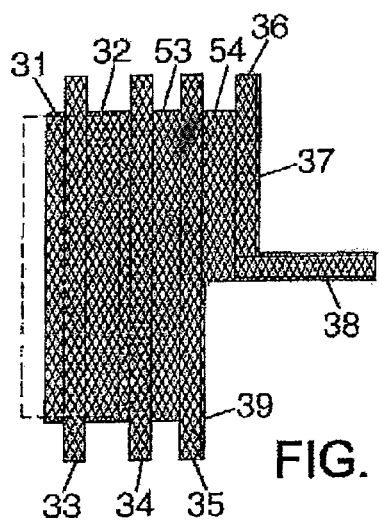

FIG. 5 illustrates the layout of the binary trim mask associated to the phase shift mask of FIG. 4. This binary trim mask is a modification of the binary trim mask of FIG. 3, the elements of which have counterparts that bear the same reference signs and that are not described again in what follows.

In addition to the opaque portions 31-39 of the binary trim mask of FIG. 3, the modified binary trim mask of FIG. 5 comprises opaque portions 53 and 54. These portions correspond to the phase shifting areas 43 and 44, respectively, of the associated phase shift mask represented in FIG. 4. All portions of the binary trim mask of FIG. 5 are contiguous one to another.

It results from the definition of the phase shift mask and of the binary trim mask thus modified, that the bottom part of line segment 13 and the portion of the line segment 14 extending in parallel to line segment 13, are complex design features in the meaning indicated above. Namely, one of their longitudinal edge is defined by the modified phase shift mask and the other one is defined by the binary trim mask. Nevertheless, these design features are at less of a risk of being disrupted, since they benefit from the upsizing effect provided through extension portions 37-39.

The present invention can be implemented in hardware, in software, or by a combination of hardware and software. Any processor, controller, or other apparatus adapted for carrying out the functionality described herein is suitable. A typical combination of hardware and software could include a general purpose microprocessor (or controller) with a computer program that, when loaded and executed, carries out the functionality described herein.

The present invention can also be embedded in a computer program product, which comprises all the features enabling the implementation of the methods described herein, and which—when loaded in an information processing system—is able to carry out these methods. Computer program means or computer program in the present context mean any expression, in any language, code or notation, of a set of instructions intended to cause a system having an information processing capability to perform a particular function either directly or after conversion to another language. Such a computer program can be stored on a computer or machine readable medium allowing data, instructions, messages or message packets, and other machine readable information to be read from the medium. The computer or machine readable medium may include non-volatile memory, such as ROM, Flash memory, Disk drive memory, CD-ROM, and other permanent storage. Additionally, a computer or machine readable medium may include, for example, volatile storage such as RAM, buffers, cache memory, and network circuits. Furthermore, the computer or machine readable medium may comprise computer or machine readable information in a transitory state medium such as a network link and/or a network interface, including a wired network or a wireless network, that allow a device to read such computer or machine readable information.

From the foregoing it will be appreciated that, although specific embodiments of the invention have been described herein for purposes of illustration, various modifications may be made without deviating from the scope of the invention. In particular, whereas the mask layouts were described with no Optical Proximity Correction (OPC) effects, such a correction may be necessary on the phase shift mask as well as the binary trim mask.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A method for printing design features within a photosensitive material using alternating Phase Shift Mask technology based on a double mask exposure strategy, comprising the steps of:

determining at least first, second and third design features adjacent one to the other, of which said first design feature has critical dimensions whereas said second and third design features do not have critical dimensions;

defining a phase shift mask and an associated binary trim mask, such that opposite edges of said first design feature are to be defined by the phase shift mask, that a first edge of said second design feature is to be defined by the phase shift mask while a second opposite edge thereof is to be defined by the binary trim mask, and that all edges of said third design feature are to be defined by the binary trim mask;

determining that said second design feature cannot be subject to an upsizing effect due to its proximity with said third design feature; and, as a result, modifying the phase shift mask definition and the associated binary trim mask definition, so that said phase shift mask becomes suitable for defining said opposite edges of said first design feature along with said first and second opposite edges of said second design feature, and for defining one edge of said third design feature, whereas said binary trim mask becomes suitable for defining another opposite edge of said third design feature with upsizing thereof; and fabricating the phase shift mask and the binary trim mask over a resist layer, in accordance with their respective definition thus modified, and lighting the resist layer through the phase shift mask and then through the binary trim mask.

2. The method according to claim 1 wherein the binary trim mask is designed to define dummy patterns as well, and wherein the localization of said dummy patterns takes into account, among other characteristics, the position and the dimensions of the upsized design features.

3. A method of fabricating a mask set comprising a phase shift mask and an associated binary trim mask, intended for printing design features within a photosensitive material using alternating Phase Shift Mask technology based on a double mask exposure strategy, comprising the steps of:

determining at least first, second and third design features adjacent one to the other, of which said first design feature has critical dimensions whereas said second and third design features do not have critical dimensions;

defining the phase shift mask and the binary trim mask, such that opposite edges of said first design feature are to be defined by the phase shift mask, that a first edge of said second design feature is to be defined by the phase shift mask while a second opposite edge thereof is to be defined by the binary trim mask, and that all edges of said third design features are to be defined by the binary trim mask;

determining that said second design feature cannot be subject to an upsizing effect due to its proximity with said third design feature; and, as a result, modifying the phase shift mask definition and the associated binary trim mask definition, so that said phase shift mask become suitable for defining said opposite edges of said first design feature along with said first and second opposite edges of said second design feature, and for defining one edge of said third design feature, whereas said binary trim mask become suitable for defining another opposite edge of said third design feature with upsizing thereof; and fabricating the phase shift mask and the binary trim mask in accordance with their respective definition thus modified.

4. The method according to claim 3 wherein the binary trim mask is designed to define dummy patterns as well, and wherein the localization of said dummy patterns takes into account, among other characteristics, the position and the dimensions of the upsized design features.

5. A method, comprising the steps of:

identifying first, second and third design features which are proximately located to one another, wherein the first design feature has critical dimensions, and the second and third design features do not have critical dimensions, but wherein at least a first portion of the second design feature cannot be subject to an upsizing effect due to its proximity to the third design feature; and defining a phase shift mask and an associated binary trim mask, such that opposite edges of the first design feature along with certain opposite edges of the second design feature associated with the first portion not to be upsized and at least a portion of one edge of the third design feature are to be defined by the phase shift mask, and further such that remaining edges of the third design feature, including an edge opposite the portion of the one edge, along with edges of the second design feature associated with a second portion that may be subject to an upsizing effect are to be defined by the binary trim mask.

6. The method of claim 5 further comprising:

fabricating the phase shift mask and the binary trim mask over a resist layer; and lighting the resist layer through the phase shift mask and then through the binary trim mask.

7. The method of claim 5, further comprising:

identifying dummy patterns; and defining the binary trim mask to include the dummy patterns as well.

8. The method of claim 7, wherein a localization of the dummy patterns takes into account at least a position and dimensions of the design features which may be subject to an upsizing effect.

9. A method, comprising the steps of:

providing a phase shift mask for first, second and third design features which are proximately located to one another, the phase shift mask defining opposite edges of the first design feature, opposite edges of the second design feature located adjacent the first design feature, and a first edge of the third design feature located adjacent the second design feature;

providing an associated binary trim mask for the first, second and third design, the binary trim mask protecting the first, second and third design features, and the binary mask further defining a second edge of the third design feature which is opposite the first edge of the third design feature, wherein the second edge of the third design feature may be subject to an upsizing effect;

lighting a resist layer first through the phase shift mask and then through the binary trim mask.

10. The method of claim 9 wherein the opposite edges of the second design feature cannot be subject to an upsizing effect due to proximity of the second design feature to the first and third design features.

11. The method of claim 10 wherein the first edge of the third design feature cannot be subject to an upsizing effect due to proximity of the third design feature to the second design feature.

12. The method of claim 9 wherein the binary trim mask further defines dummy patterns whose position in the mask takes into account at least the position of the second edge of the third design feature which may be subject to an upsizing effect.

* * * * *

UNITED STATES PATENT AND TRADEMARK OFFICE
CERTIFICATE OF CORRECTION

PATENT NO. : 7,615,318 B2
APPLICATION NO. : 11/253061
DATED : November 10, 2009
INVENTOR(S) : Patterson et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 816 days.

Signed and Sealed this

Nineteenth Day of October, 2010

David J. Kappos
*Director of the United States Patent and Trademark Office*